(12) United States Patent
Wu et al.

(10) Patent No.: US 8,300,390 B2
(45) Date of Patent: Oct. 30, 2012

(54) CHASSIS

(75) Inventors: Kaijun Wu, Shenzhen (CN); Zhenyu Zhuang, Shenzhen (CN); Junning Wang, Shenzhen (CN); Xin Wan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 610 days.

(21) Appl. No.: 11/993,526

(22) PCT Filed: Jul. 19, 2006

(86) PCT No.: PCT/CN2006/001763
§ 371 (c)(1),
(2), (4) Date: Aug. 12, 2010

(87) PCT Pub. No.: WO2007/025440
PCT Pub. Date: Mar. 8, 2007

(65) Prior Publication Data
US 2010/0315771 A1    Dec. 16, 2010

(30) Foreign Application Priority Data
Aug. 31, 2005  (CN) ...................... 2005 2 0106997 U

(51) Int. Cl.
*G06F 1/16*    (2006.01)
*G06F 1/20*    (2006.01)

(52) U.S. Cl. .............. 361/679.02; 361/679.01; 361/826; 361/827; 361/829; 174/50; 174/51

(58) Field of Classification Search ............. 361/679.01, 361/679.02, 679.46–679.5, 110–113, 600–603, 361/622, 624, 611, 637, 640, 679, 686, 826, 361/827, 724–730; 174/48, 51, 50.52, 59, 174/68.1, 68.2, 68.3, 72 A, 72 C, 72 R, 99 R, 174/100, 101, 17 R, 160, 153, 65 R, 67, 95, 174/135, 136, 96; 312/223.1, 223.2, 223.3, 312/223.6, 264, 236
See application file for complete search history.

(56) References Cited

U.S. PATENT DOCUMENTS 5,216,579 A *  6/1993  Basara et al. ............ 361/679.46
(Continued)

FOREIGN PATENT DOCUMENTS

| CN | 2341344 | 9/1999 |
|---|---|---|
| CN | 2580692 | 10/2003 |
| JP | 5-82993 | 4/1993 |
| JP | 6-61677 | 3/1994 |

(Continued)

OTHER PUBLICATIONS

European Search Report-dated Aug. 4, 2008; Application No./Patent No. 06761498.2-1242 / 1887704 PCT/CN2006001763.

*Primary Examiner* — Michail V Datskovskiy
(74) *Attorney, Agent, or Firm* — Conley Rose, P.C.; Grant Rodolph

(57) ABSTRACT

A chassis includes a main body having a backplane, a top cover plate, a bottom cover plate and left and right side plates connected with each other. An upper slide rail and a lower slide rail for securing single boards are provided in the main body, a fan is arranged at the upper position of the main body and a power distribution unit is arranged at the lower position of the main body, and a coupling element for coupling the fan with the power distribution unit is provided in the chassis. The coupling element may be a groove extending from the upper position to the lower position for accommodating cables and formed in the inner side of the side plate of the chassis, or may be two openings for passage of cables respectively provided at an upper position and a lower position of the side plate of the chassis.

12 Claims, 4 Drawing Sheets

U.S. PATENT DOCUMENTS

| | | | | |
|---|---|---|---|---|
| 5,286,919 | A * | 2/1994 | Benson et al. | 174/50 |
| 5,936,198 | A * | 8/1999 | Rentmore | 174/51 |
| 5,957,556 | A * | 9/1999 | Singer et al. | 312/223.6 |
| 6,011,221 | A * | 1/2000 | Lecinski et al. | 174/72 A |
| 6,016,252 | A * | 1/2000 | Pignolet et al. | 361/724 |
| 6,301,095 | B1 * | 10/2001 | Laughlin et al. | 361/624 |
| 6,373,721 | B2 * | 4/2002 | Lecinski et al. | 361/826 |
| 6,414,845 | B2 | 7/2002 | Bonet | |
| 6,734,354 | B2 * | 5/2004 | McClellan et al. | 174/481 |
| 6,785,459 | B2 * | 8/2004 | Schmidt et al. | 385/134 |
| 6,882,530 | B2 * | 4/2005 | Cyphers et al. | 361/829 |
| 7,087,840 | B2 * | 8/2006 | Herring et al. | 174/101 |
| 7,345,239 | B2 * | 3/2008 | Tousignant et al. | 174/68.1 |
| 2002/0197045 | A1 * | 12/2002 | Schmidt et al. | 385/134 |
| 2003/0188880 | A1 * | 10/2003 | McClellan et al. | 174/48 |
| 2004/0190270 | A1 * | 9/2004 | Aldag et al. | 361/752 |

FOREIGN PATENT DOCUMENTS

| | | | |
|---|---|---|---|
| JP | 06061677 A | * | 3/1994 |
| JP | 8-264970 | | 10/1996 |
| JP | 10256761 A | * | 9/1998 |
| JP | 02003219925 A | * | 8/2003 |

* cited by examiner

CHASSIS

CROSS-REFERENCES TO RELATED APPLICATIONS

This application claims the benefit of Chinese Patent Application No. 200520106997.5 filed on Aug. 31, 2005.

FIELD OF THE INVENTION

The present invention relates to the manufacturing of communication, electronic and electrical equipments, and particularly to a chassis for accommodating communication and electronic devices or modules.

BACKGROUND OF THE INVENTION

In communication systems as well as electronic and electrical equipments, chassis is commonly used to accommodate single boards, fans and all kinds of elements. The chassis which has a compact configuration and can be easily assembled and unassembled is becoming increasingly popular.

In order to satisfy the various user requirements, integrated chassis allowing plugging plug-in unit from both front and rear sides are more and more widely used. In the prior art, a typical integrated chassis allowing plug-in unit plugging from both front and rear sides is illustrated in FIG. 1. Single boards 3 and 4 are plugged into the chassis so that they occupy the full width of the chassis. Therefore, to achieve a compact chassis with reliable heat dissipation, there is a need to provide a fan and a power distribution unit in the chassis, for example, a fan 1 is arranged at the upper position of the chassis and a power distribution unit 5 is arranged at the lower position of the chassis. In such a chassis, the power supply solution for the fan is designed to provide a backplane 2 extending to the fan region, provide a fan connector plugged into the backplane 2 directly, arrange a power supply path in the backplane 2 and thus lead electrical power from the lower position to the upper position via the backplane to supply the fan.

The above solution may satisfy the requirements in a certain extent. However, the backplane is equipped with connectors for single boards and the available space is limited. It is difficult to preset the space for the power supply path in the design process, especially when a large current is required. Accordingly, there is a problem that the prior chassis configuration is not reasonable.

SUMMARY OF THE INVENTION

One object of the present invention is to provide a chassis with an improved configuration.

The present invention provides a chassis, which includes a main body and a device configured to arrange cables. The main body includes a backplane, a top cover plate, a bottom cover plate and two side plates, and the device is defined in at least one of the two side plates of the chassis.

More preferably, the device configured to arrange the cables includes a groove defined in the inner of the at least one of the two side plates, and the space surrounded by the groove is configured to contain the cables.

More preferably, the device configured to arrange the cables further includes a cable routing cover configured to cover the cables within the groove.

More preferably, the cable routing cover is a rectangular flat plate.

More preferably, the device configured to arrange the cables includes a first opening defined in the at least one of the two side plates at an upper position and a second opening defined in the at least one of the two side plates at a lower position, wherein the cables pass through the first opening and the second opening to connect a first module with the second module.

More preferably, a fan unit is arranged at the upper position of the main body and a power distribution unit is arranged at the lower position of the main body, one end of the cables is connected to the fan unit and the other end of the cables is connected to the power distribution unit.

More preferably, the device configured to arrange the cables further includes a cable routing cover adapted to cover the cables exposed outside of the chassis.

More preferably, the cable routing cover is an elongated, peripherally closed sheath.

More preferably, the cable routing cover is provided with elastic conductors along the inner peripheral thereof.

Another aspect of the invention provides a chassis which includes a main body, a first module arranged at an upper position of the main body and a second module arranged at a lower position of the main body. The main body includes a backplane, a top cover plate, a bottom cover plate and two side plates, the first module and the second module are connected by cables, and a groove for containing the cables is defined in the inner of the at least one of the two side plates.

More preferably, the chassis further includes a cable routing cover configured to cover the cables within the groove.

A Further aspect of the invention provides a chassis, which includes a main body, a first module arranged at an upper position of the main body and a second module arranged at a lower position of the main body. The main body has a backplane, a top cover plate, a bottom cover plate and two side plates, a first opening is defined in at least one of the two side plates at the upper position and a second opening is defined in the at least one of the two side plates at the lower position, and cables pass through the first opening and the second opening to connect the first module with the second module.

More preferably, the chassis further includes a cable routing cover configured to cover the cables exposed outside of the chassis.

More preferably, the cable routing cover is provided with elastic conductors along the inner peripheral thereof.

With either of the two types of structures, an upper functional unit and a lower functional unit of the integrated chassis may be easily connected via cables, without providing any circuit path in the backplane. Therefore, the structure of the backplane may be simplified, and the manufacturing cost may be reduced. Meanwhile, the cable routing cover may cover the cables to provide a good protection and shielding therefor.

BRIEF DESCRIPTION OF THE DRAWINGS

The present invention will be described in more detail hereinafter in conjunction with embodiments with reference to accompanying figures.

DETAILED DESCRIPTION OF THE INVENTION

For a better understanding of the structure and features of the present invention, a detailed description will be given hereinafter in conjunction with embodiments with reference to accompanying figures.

Embodiment 1

Figure 1:
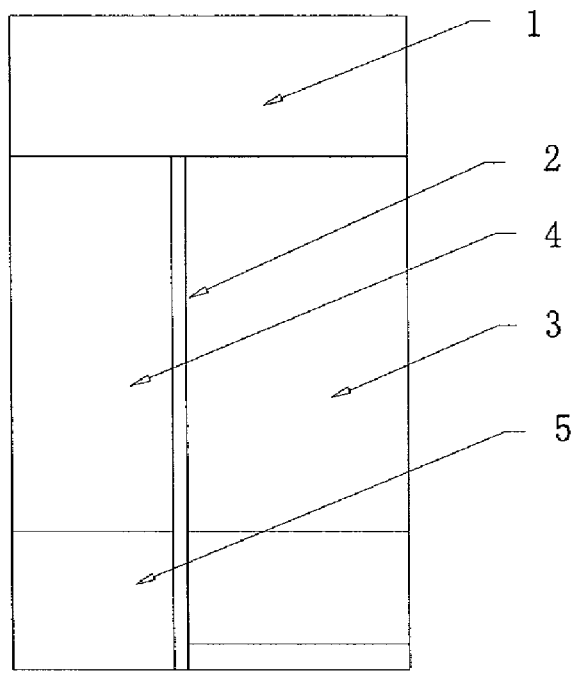
FIG. 1 illustrates a side view of an integrated chassis allowing plug-in unit plugging plug-in unit from both front and rear sides.

FIG. 1 is a side view of an integrated chassis allowing plugging plug-in unit from both front and rear sides. Referring to FIG. 1, the chassis of the present invention includes a fan 1 and a power distribution unit 5 (installation regions thereof rather than physical objects are shown in the Figure), and the fan 1 is arranged at the upper position of the chassis and the power distribution unit 5 is arranged at the lower position of the chassis. The chassis further comprises a front plugboard 3 arranged on the left side within the chassis, a back plugboard 4 arranged on the right side within the chassis, and a backplane 2 perpendicularly arranged between the front plugboard 3 and the back plugboard 4.

Figure 2:
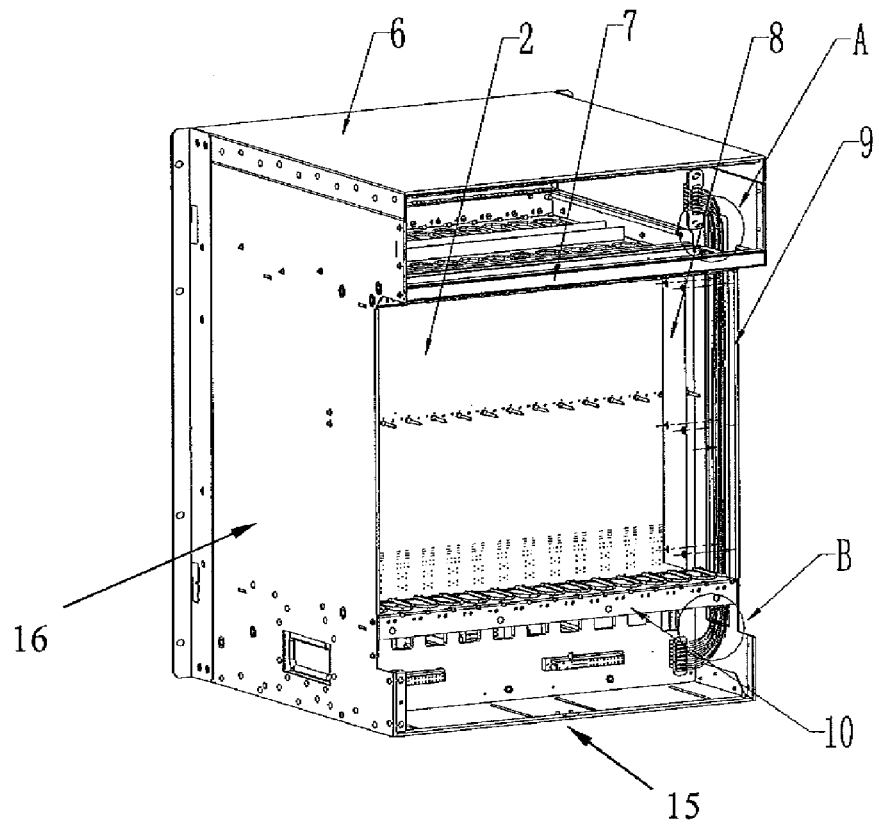
FIG. 2 illustrates a perspective view of a chassis according to one embodiment of the present invention.

FIG. 2 is a perspective view of the chassis according to the present invention. As shown in FIG. 2, the chassis according to the present invention includes a main body formed by a backplane 2, a top cover plate 6, a bottom cover plate 15, a left side plate 16 and a right side plate 9 connected with each other. The chassis further includes slide rail for securing single boards (the array of the single boards not shown), e.g., an upper slide rail 7 and a lower slide rail 10 parallel to the top and bottom cover plates are arranged in the upper region and the lower region of the main body, respectively. Two ends of each of the upper slide rail 7 and a lower slide rail 10 are respectively secured to the left side plate 16 and the right side plate 9, and the distance between the upper slide rail 7 and a lower slide rail 10 is determined according to the length of the secured single boards. A side plate groove 12 extending from the upper position to the lower position is formed on the inner side of the side plate 9. The groove may be semi-circle, square, U-shaped, or any other shape suitable to accommodate cables.

Referring to FIG. 2, cables 11 are placed into the side plate groove 12 so that the fan 1 and the power distribution unit 5 are interconnected by means of the cables 11, without occupying internal space for the single boards. According to the present invention, the main body further includes a cable routing cover 8 used to cover the cables 11 within the side plate groove 12 and achieve a good protection and shielding.

Figure 3:
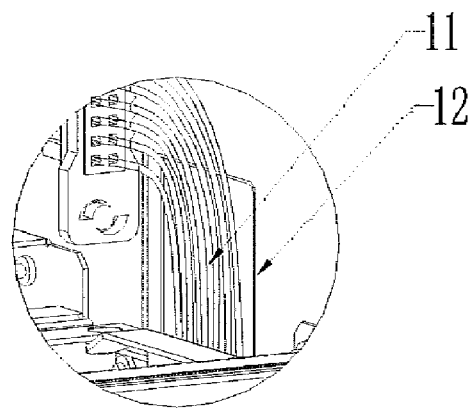
FIG. 3 illustrates a partially enlarged view of a portion "A" indicated in FIG. 2.

FIG. 3 is a partially enlarged view of a portion "A" indicated in FIG. 2. Referring to FIG. 3, the cables 11 pass through the upper slide rail 7 to run in the side plate groove 12.

Figure 4:
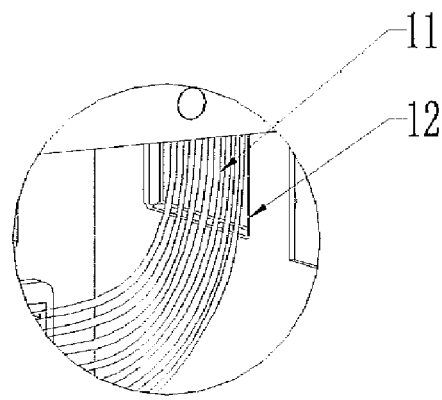
FIG. 4 illustrates a partially enlarged view of a portion "B" indicated in FIG. 2.

FIG. 4 is a partially enlarged view of a portion "B" indicated in FIG. 2. Referring to FIG. 4, the cables 11 pass by the lower slide rail 10 to come out from the side plate groove 12. In the case that single boards occupy the major space in the main body, if cables pass through slide rails to come into/out from the main body, then the region where single boards is arranged is bypassed and there is thus no need to pass across single boards, thereby simplifying the structure of the main body and reducing the difficulty of adding or removing the single boards.

Figure 5:
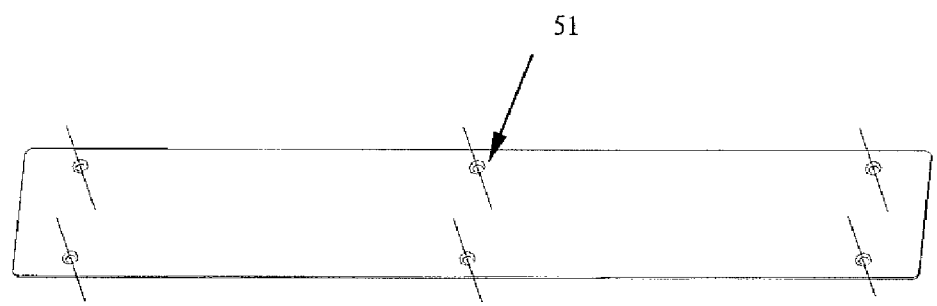
FIG. 5 illustrates a structural diagram of a cable routing cover according to the embodiment of the present invention.

FIG. 5 is a structural diagram of a cable routing cover according to the present invention. As shown in FIG. 5, the cable routing cover 8 is a rectangular, flat plate with screw holes 51 therein. There are six screw holes in total, with each group comprising 3 holes. The groups are symmetrically arranged along the two sides of the cable routing cover. Although the screw holes are shown as circular in FIG. 5, other shape such as hexagon is also possible. Screws pass through the six screw holes to secure the cable routing cover to the inner side of the side plate.

Embodiment 2

Figure 6:
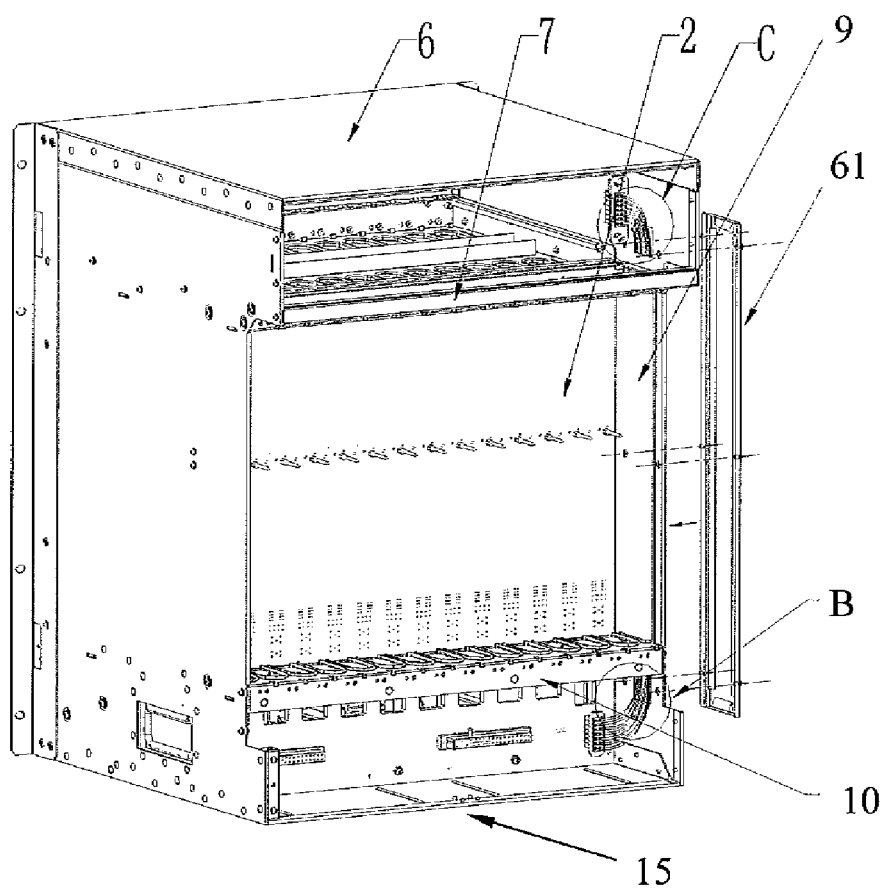
FIG. 6 illustrates a perspective view of a chassis according to another embodiment of the present invention.

FIG. 6 is a perspective view of a chassis according to another embodiment of the present invention. As shown in FIG. 6, the present embodiment is different from embodiment 1 in that the configuration for connecting the fan and the power distribution unit is different. Two openings are defined in the side plate 9 at an upper position and a lower position, respectively. Cables 11 pass through the two openings to connect the fan 1 with the power distribution unit 5. The chassis is also provided with a cable routing cover 61 for covering the cables 11 from the outside to achieve a good protection and shielding.

Figure 7:
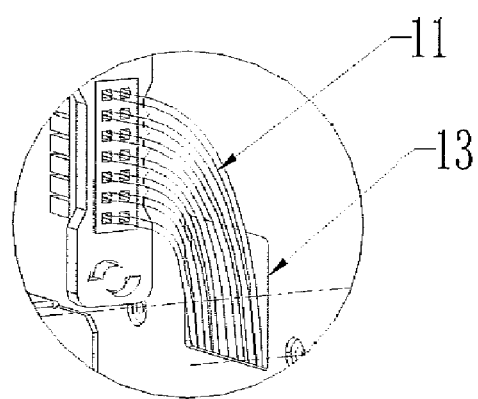
FIG. 7 illustrates a partially enlarged view of a portion "C" indicated in FIG. 6.

FIG. 7 illustrates a partially enlarged view of a portion "C" indicated in FIG. 6. Referring to FIG. 7, the cables 11 pass through the opening 13 of the upper side plate to come out from the main body.

Figure 8:
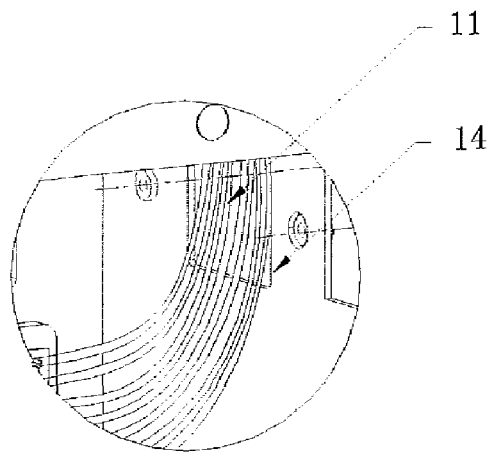
FIG. 8 illustrates a partially enlarged view of a portion "D" indicated in FIG. 6.

FIG. 8 is a partially enlarged view of a portion "D" indicated in FIG. 6. Referring to FIG. 8, the cables 11 pass through the opening 14 of the lower side plate to come into the main body. In these Figures, the openings 13 and 14 are shown as square. Other shapes suitable for passage of cables, such as circle or ellipse, are also possible.

Figure 9:
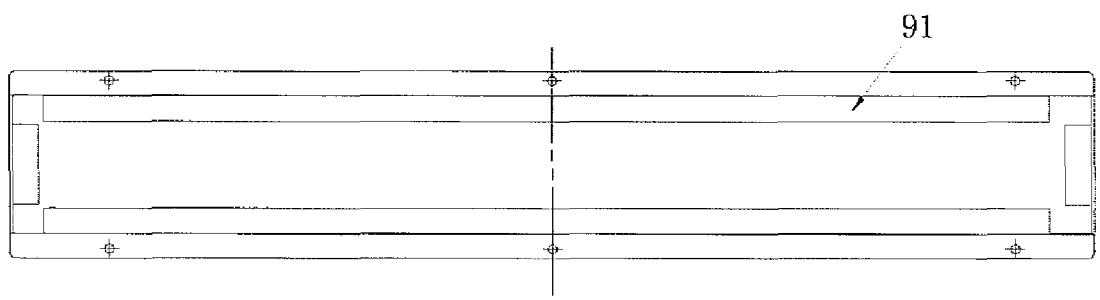
FIG. 9 illustrates a structural diagram of a cable routing cover used according to another embodiment of the present invention.

FIG. 9 is a structural diagram of a cable routing cover used in the chassis according to another embodiment of the present invention. As shown in FIG. 9, the cable routing cover is an elongated, peripherally closed sheath. Elastic conductors such as conductive fabrics or spring leafs are adhered to the inner peripheral wall 91 of the elongated sheath. The elastic conductors allow a close contact between the cable routing cover and the side plate of the chassis so as to achieve a better shielding.

It can be seen that, according to the present invention, no special current path are required to be provided in the backplane. On the contrary, the fan 1 and the power distribution unit 5 are interconnected via the cables arranged within the groove so that power may be supplied to the fan. According to the present invention, the requirement to supply power to an upper-arranged fan from a lower-arranged power supply can be satisfied. Therefore, the structure of backplane may be simplified, and the manufacturing cost may be greatly reduced.

What is claimed is:

1. A chassis, comprising:
   a main body; and
   a device configured to arrange cables;
   wherein the main body comprises a backplane, a top cover plate, a bottom cover plate and two side plates, and the device is defined in at least one of the two side plates of the chassis, wherein the device configured to arrange the cables comprises a groove defined in the inner of the at least one of the two side plates, and wherein the space surrounded by the groove is configured to contain the cables.

2. The chassis according to claim 1, wherein the device configured to arrange the cables further comprises a cable routing cover configured to cover the cables within the groove.

3. The chassis according to claim 2, wherein the cable routing cover is a rectangular flat plate.

4. The chassis according to claim 1, wherein the device configured to arrange the cables comprises a first opening defined in the at least one of the two side plates at an upper position and a second opening defined in the at least one of the two side plates at a lower position, wherein the cables pass through the first opening and the second opening to connect a first module with the second module.

5. A chassis, comprising:
a main body; and
a device configured to arrange cables,
wherein the main body comprises a backplane, a top cover plate, a bottom cover plate and two side plates, and the device is defined in at least one of the two side plates of the chassis,
wherein a fan unit is arranged at the upper position of the main body,
wherein a power distribution unit is arranged at the lower position of the main body, and
wherein one end of the cables is connected to the fan unit and the other end of the cables is connected to the power distribution unit.

6. A chassis, comprising:
a main body;
a device configured to arrange cables;
wherein the main body comprises a backplane, a top cover plate, a bottom cover plate and two side plates, and the device is defined in at least one of the two side plates of the chassis, and
wherein the device configured to arrange the cables further comprises a cable routing cover adapted to cover the cables exposed outside of the chassis.

7. The chassis according to claim 6, wherein the cable routing cover is an elongated, peripherally closed sheath.

8. The chassis according to claim 6, wherein the cable routing cover is provided with elastic conductors along the inner peripheral thereof.

9. A chassis, comprising a main body, a first module arranged at an upper position of the main body and a second module arranged at a lower position of the main body, the main body comprising a backplane, a top cover plate, a bottom cover plate and two side plates, wherein the first module and the second module are connected by cables, a groove for containing the cables is defined in the inner of the at least one of the two side plates.

10. The chassis according to claim 9, wherein the chassis further comprises a cable routing cover configured to cover the cables within the groove.

11. A chassis, comprising a main body, a first module arranged at an upper position of the main body and a second module arranged at a lower position of the main body, the main body having a backplane, a top cover plate, a bottom cover plate and two side plates, wherein a first opening is defined in at least one of the two side plates at the lower position, cables pass through the first opening and the second opening to connect the first module with the second module, wherein the chassis further comprises a cable routing cover configured to cover the cables exposed outside of the chassis.

12. The chassis according to claim 11, wherein the cable routing cover is provided with elastic conductors along the inner peripheral thereof.

* * * * *

UNITED STATES PATENT AND TRADEMARK OFFICE
CERTIFICATE OF CORRECTION

PATENT NO.        : 8,300,390 B2                                          Page 1 of 1
APPLICATION NO.   : 11/993526
DATED             : October 30, 2012
INVENTOR(S)       : Kaijun Wu et al.

It is certified that error appears in the above-identified patent and that said Letters Patent is hereby corrected as shown below:

Front Page:
(30) Foreign Application Priority Data: Delete "Aug. 31, 2005 (CN).........2005 2 0106997 U" and insert --Aug. 31, 2005 (CN).........200520106997.5--.

Signed and Sealed this
Twenty-sixth Day of February, 2013

Teresa Stanek Rea
*Acting Director of the United States Patent and Trademark Office*